United States Patent
Liu et al.

(10) Patent No.: US 10,600,644 B2
(45) Date of Patent: Mar. 24, 2020

(54) MONO- AND MULTILAYER SILICENE PREPARED BY PLASMA-ENHANCED CHEMICAL VAPOR DEPOSITION

(71) Applicant: The Government of the United States of America, as represented by the Secretary of the Navy, Arlington, VA (US)

(72) Inventors: Xiao Liu, Fairfax, VA (US); Battogtokh Jugdersuren, Alexandria, VA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 62 days.

(21) Appl. No.: 16/033,397

(22) Filed: Jul. 12, 2018

(65) Prior Publication Data

US 2019/0043718 A1    Feb. 7, 2019

Related U.S. Application Data

(60) Provisional application No. 62/541,125, filed on Aug. 4, 2017.

(51) Int. Cl.
  *H01L 21/31*       (2006.01)
  *H01L 21/02*       (2006.01)
  (Continued)

(52) U.S. Cl.
  CPC ...... *H01L 21/02532* (2013.01); *C30B 25/105* (2013.01); *C30B 25/18* (2013.01);
  (Continued)

(58) Field of Classification Search
  CPC ........... H01L 21/02178; H01L 21/0228; H01L 21/02422; H01L 21/02425;
  (Continued)

(56) References Cited

U.S. PATENT DOCUMENTS 9,472,745 B2  10/2016  Liu et al.
9,577,174 B2   2/2017  Liu et al.

FOREIGN PATENT DOCUMENTS

WO      2017029470 A1      2/2017

OTHER PUBLICATIONS

Epitaxial growth of silicene on ultra-thin Ag(111) films, New Journal of Physics, 16 (2014). (Year: 2014).*
(Continued)

*Primary Examiner* — Brook Kebede
(74) *Attorney, Agent, or Firm* — US Naval Research Laboratory; Joslyn Barritt

(57) ABSTRACT

Processes for fabricating multi- and monolayer silicene on catalyst metal surfaces by means of plasma-enhanced chemical vapor deposition (PECVD). Silicene is grown by means of PECVD from a starting mixture of $H_2$ and $SiH_4$ having an $H_2$:$SiH_4$ ratio of 100 to 400 on an Ag(111) substrate having a substrate temperature between 20° C. and 290° C., with the deposition being performed for about 10-25 minutes at an RF power between 10 W and 500 W and under a chamber pressure between about 100 mTorr and 1300 mTorr. In most cases, the substrate will be in the form of an Ag(111) film sputtered on a fused silica substrate. A multi-layer silicene film can be formed by extending the deposition time past 25 minutes.

24 Claims, 12 Drawing Sheets

(51) Int. Cl.
    C30B 29/06    (2006.01)
    C30B 25/18    (2006.01)
    C30B 25/10    (2006.01)
    C30B 29/60    (2006.01)
    H01L 29/16    (2006.01)

(52) U.S. Cl.
    CPC .............. *C30B 29/06* (2013.01); *C30B 29/60* (2013.01); *H01L 21/0228* (2013.01); *H01L 21/0262* (2013.01); *H01L 21/02178* (2013.01); *H01L 21/02422* (2013.01); *H01L 21/02425* (2013.01); *H01L 21/02433* (2013.01); *H01L 21/02491* (2013.01); *H01L 21/02516* (2013.01); *H01L 21/02661* (2013.01); *H01L 21/0242* (2013.01); *H01L 21/02381* (2013.01); *H01L 21/02417* (2013.01); *H01L 29/16* (2013.01)

(58) Field of Classification Search
    CPC ......... H01L 21/02433; H01L 21/02491; H01L 21/02516; H01L 21/0262; H01L 21/02661; H01L 21/02532; C30B 25/105; C30B 25/18; C30B 29/06; C30B 29/60
    USPC .................................................. 438/758, 792
    See application file for complete search history.

(56) References Cited

OTHER PUBLICATIONS

Wang et al., Band structure of hydrogenated silicene on Ag(111): Evidence for silicane, Phys. Rev. B., 93, 081406 (2016). (Year: 2016).*
Li Tao et al., "Silicene field-effect transistors operating at room temperature," Nature Nanotech. 10, 227 (2015).
Lok C. Lew Yan Voon, "Silicene," Springer International Publishing Switzerland 2016 M.J.S. Spencer and T. Morishita (eds.), at pp. 3-33.
Baojie Feng et al., "Evidence of Silicene in Honeycomb Structures of Silicon on Ag(111)," Nano Letters 12, 3507, (2012).
Lei Meng et al., "Buckled Silicene Formation on Ir(111)," Nano Letters 13, 685 (2013).
Antoine Fleurence et al., "Experimental Evidence for Epitaxial Silicene on Diboride Thin Films," Phys. Rev. Lett. 108, 245501 (2012).
J. Koh, et al., "Optimization of hydrogenated amorphous silicon p-i-n solar cells with two-step i layers guided by real-time spectroscopic ellipsometry," Appl. Phys. Lett. 73, 1526 (1998).
J. Qiu, et al., "Ordered and Reversible Hydrogenation of Silicene," Phys. Rev. Lett. 114, 126101 (2015).
L. C. Lew Yan Voon, et al, "Hydrogen compounds of group-IV nanosheets," Appl. Phys. Lett. 97, 163114 (2010).
R. Zhang et al., "Silicane as an Inert Substrate of Silicene: A Promising Candidate for FET," J. Phys. Chem. C 2014, 118, 25278-25283.
J. Wang et al., "Hydrogen storage by metalized silicene and silicane," Journal of Applied Physics 114, 124309 (2013).
C. Zhang et al., "First-Principles Study of Ferromagnetism in Two-Dimensional Silicene with Hydrogenation," J. Phys. Chem. C, 2012, 116 (6), pp. 4163-4166.
Yi Du et al., "Tuning the Band Gap in Silicene by Oxidation," ACS Nano 8, 10019 (2014).
Supplementary information of Li Tao et al., "Silicene field-effect transistors operating at room temperature," Nature Nanotech 10, 227 (2015).
Alessandro Molle et al., "Hindering the Oxidation of Silicene with Non-Reactive Encapsulation," Adv. Func. Mater. 23, 4340 (2013).
L.M. Malard, M.A. Pimenta, G. Dresselhaus, and M.S. Dresselhaus, "Raman spectroscopy in graphene," Physics Reports 473 (2009).
Search Report and Written Opinion dated Nov. 30, 2018 in corresponding International Application No. PCT/US2018/041749.
Li Hui et al. "Silicene: from mono layer to multi layer—A concise review," Chin. Phys. B, vol. 24. No. 8, 2015, pp. 086102-1-086102-10.
Medina et al. "Hydrogenation of silicene films grown on Ag(III)," Journal of Electron Spectroscopy and Related Phenomena 219. Nov. 13, 2016, pp. 57-62.
Wei et al. "Hydrogenation of slicene on Ag(III) and formation of half-silicane," Journal of Materials Chemistry A, Jul. 28, 2017, pp. 18128-18137.

* cited by examiner (top view)

(side view)

ΔZ

MONO- AND MULTILAYER SILICENE PREPARED BY PLASMA-ENHANCED CHEMICAL VAPOR DEPOSITION

CROSS-REFERENCE

This Application is a Nonprovisional of, and claims the benefit of priority pursuant to 35 U.S.C. § 119 based on, U.S. Provisional Patent Application No. 62/541,125 filed on Aug. 4, 2017. The Provisional application and all references cited herein are hereby incorporated by reference into the present disclosure in their entirety.

TECHNICAL FIELD

The present disclosure relates to the fabrication of silicene, particularly to the fabrication of multi- and monolayer silicene on catalyst metal surfaces.

BACKGROUND

Cutting-edge high efficiency microelectronics is vital in a wide range of commercial and military applications. To some extent, it is the driving force behind current semiconductor technology. As we approach sub-10 nm scale in fabrication, revolutionary technology is needed to reach the ultimate miniaturization of high density, high throughput, yet highly energy efficient next generation microelectronics.

In this regard, graphene is the most-researched 2D material because of its unique electronic properties such as a very high carrier mobility. However, graphene lacks an energy band gap, a prerequisite for modern electronics, and is unsuitable for making transistors. Scientists are still trying to design a graphene-based transistor by structure and chemical modifications.

Silicene—the silicon counterpart of graphene—shares many exceptional electronic properties with graphene. The schematics in FIG. 1A (top view) and 1B (side view) illustrate the structure of silicene. Both silicene and graphene possess a Dirac cone and linear electronic dispersion around the F point, and both contain massless Dirac fermions that carry charge. Although both form hexagonal structures, graphene is completely flat, while, as illustrated in the schematics shown in FIGS. 1A and 1B, silicene has a low-buckled honeycomb atomic arrangement of sp2/sp3-like hybridized silicon atoms that is expected to have an easily tunable band gap under an external electric field.

Despite the similarities between graphene and silicene, one of the most notable differences is that silicene has an easily tunable band gap and is fully compatible with current silicon-based microelectronics. In one potentially significant development, a silicene field-effect transistor has recently been demonstrated. See Li Tao et al., "Silicene field-effect transistors operating at room temperature," *Nature Nanotech.* 10, 227 (2015). The potential applications of such silicene-based transistors and other silicene-based devices could revolutionize many technological areas such as autonomous systems, communication, sensing, and surveillance.

Currently there is no evidence of existence of natural silicene, nor is there any solid phase of silicon similar to the naturally occurring graphite form of carbon. While the growth mechanism of silicene is still not well understood, molecular beam epitaxy (MBE), one of the most sophisticated film growth methods known at present, is the only technique used to grow silicene.

So far all the experimental characterization of structural and electronic properties of silicene have been performed on such MBE silicene materials. See Lok C. Lew Yan Voon, *Silicene*, Springer International Publishing Switzerland 2016 M. J. S. Spencer and T. Morishita (eds.), at pp. 3-33. Using MBE, silicene has been deposited on Ag(111), Ir (111), and $ZrB_2$ (111) surfaces at substrate temperature of 200-250° C. See Baojie Feng et al., "Evidence of Silicene in Honeycomb Structures of Silicon on Ag(111)," *Nano Letters* 12, 3507, (2012); Lei Meng et al., "Buckled Silicene Formation on Ir(111)," *Nano Letters* 13, 685 (2013); and Antoine Fleurence et al., "Experimental Evidence for Epitaxial Silicene on Diboride Thin Films," *Phys. Rev. Lett.* 108, 245501 (2012).

However, MBE formation of silicene requires multiple processing steps in a stringently maintained ultrahigh vacuum environment. Control of nucleation of Si atoms into silicene during MBE can cause deposition of even a single monolayer to take as long as several hours. Consequently, alternative growth methods are needed for potential large scale synthesis and application.

Plasma-enhanced chemical vapor deposition (PECVD) uses reactant gases which are decomposed in a radio-frequency-driven plasma environment. It is a versatile and cost-effective way to deposit various thin film materials in industrial scale.

PECVD has been widely used to deposit amorphous thin films such as amorphous silicon (a-Si), silicon nitride ($SiN_x$), and silicon dioxide (a-$SiO_2$). By introducing hydrogen gas ($H_2$) to dilute silane gas ($SiH_4$), it is possible to deposit nc-Si when $H_2$ to $SiH_4$ ratio exceeds 30. See J. Koh, et al., "Optimization of hydrogenated amorphous silicon p-i-n solar cells with two-step i layers guided by real-time spectroscopic ellipsometry," *Appl. Phys. Lett.* 73, 1526 (1998).

The inventors of the present invention have previously used CVD to grow nanocrystalline silicon (nc-Si). See U.S. Pat. No. 9,577,174, to Liu et al., entitled "CVD Nanocrystalline Silicon Thermoelectric Material" (PECVD) and U.S. Pat. No. 9,472,745, to Liu et al., entitled "CVD Nanocrystalline Silicon Thermoelectric Material" (hot-wire CVD, or "HWCVD"). The nc-Si produced in accordance with the inventors' prior inventions has demonstrated record-breaking low thermal conductivity among nonporous silicon material of any type, with a room-temperature thermal conductivity of a factor of three below the minimum thermal conductivity of silicon. When doped by ion implantation, nc-Si also shows promising thermoelectric performance at room temperature.

The inventors of the present invention have used PECVD to deposit nc-Si with ultrafine grain sizes (2-3 nm). Average grain sizes of 3 nm and individual layer thickness of 5 nm have been obtained, as confirmed by both high resolution TEM and X-ray diffraction studies. By controlling RF power, chamber gas pressure, substrate temperature, and $H_2$:$SiH_4$ dilution ratio, the inventors of the present invention have found that grain sizes can be controlled so that a multi-layer nc-Si film, each layer having its own distinct grain size, could be deposited. See '174 patent, supra.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides processes for fabricating multi- and monolayer silicene on catalyst metal surfaces by means of plasma-enhanced chemical vapor deposition (PECVD).

In accordance with the present invention, silicene can be grown by means of PECVD from a starting mixture of $H_2$ and $SiH_4$ having an $H_2$:$SiH_4$ ratio of 100 to 400 on a substrate having a substrate temperature between 20° C. and 290° C., with the deposition being performed for about 10-25 minutes at an RF power between 10 W and 500 W and under a chamber pressure between about 100 mTorr and 1300 mTorr. A multi-layer silicene film can be formed by extending the deposition time past 25 minutes.

In most cases, the substrate will be in the form of an Ag(111) film sputtered or electron-beam evaporated on a fused silica substrate.

The PECVD process in accordance with the present invention produces silicene having structural properties that are similar to those of silicene prepared by conventional molecular beam epitaxy (MBE) processes, but does so using a much simpler process that is more amenable to large-scale production and application development. Moreover, the PECVD process of the present invention produces a naturally hydrogenated silicene which is more stable and less subject to oxidation than is conventional MBE silicene.

Use of PECVD to grow silicene in accordance with the present invention is expected to similarly expedite the research and development of this fascinating material for applications in nanoscale electronics.

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides a method for growing silicene using plasma-enhanced chemical vapor deposition (PECVD) and further provides hydrogenated silicene produced by PECVD in accordance with the methods described herein.

Use of PECVD to grow silicene has numerous advantages over the MBE methods of the prior art in that it can achieve deposition at a less-stringent vacuum environment, with significantly fewer processing steps and shorter overall synthesis time.

CVD has been an increasingly popular method for growing graphene. CVD graphene has replaced MBE graphene and other graphene deposition techniques as a preferred way for graphene synthesis and is enabling the development of graphene for electronic and other applications. Use of PECVD to grow silicene in accordance with the present invention is expected to similarly expedite the research and development of this fascinating material for applications in nanoscale electronics.

The present invention modifies the PECVD process for producing multi-layer nc-Si described in U.S. Pat. No. 9,577,174, supra, to enable the PECVD deposition of a monolayer or a multilayer of silicon atoms as silicene on Ag or other catalyst metal and semiconductor surfaces.

Figure 1A:
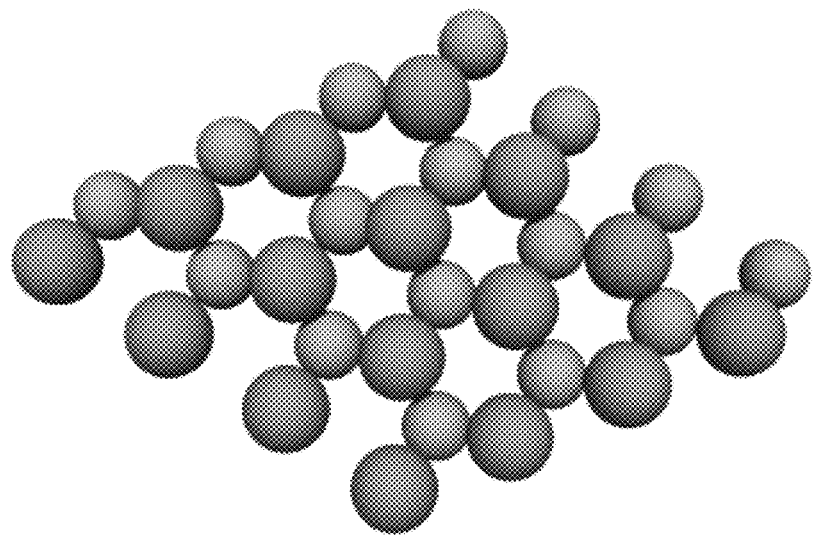
FIGS. 1A and 1B are top and side views illustrating the lattice structure of a two-dimensional monolayer of silicene.
Figure 1B:
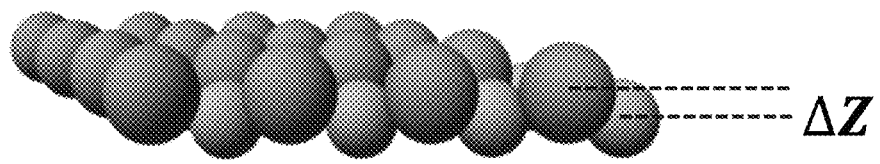
Figure 2:
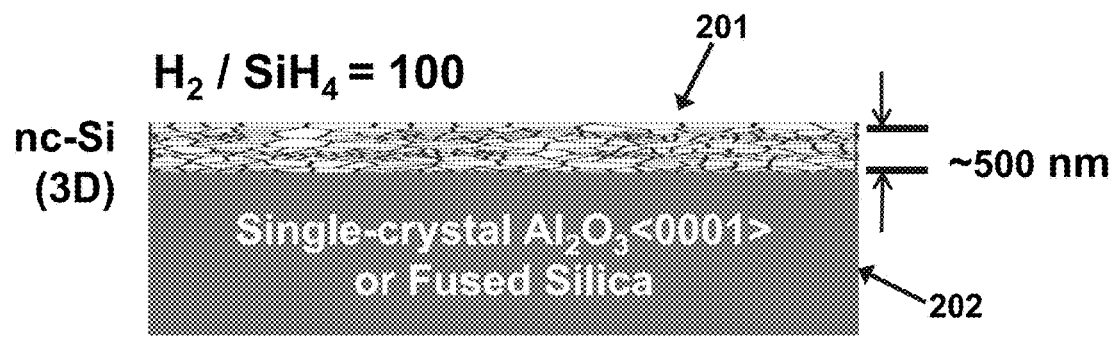
FIG. 2 is a block schematic illustrating aspects of an exemplary deposition of three-dimensional nanocrystalline silicon (nc-Si) on a substrate in accordance with the prior art.
Figure 3:
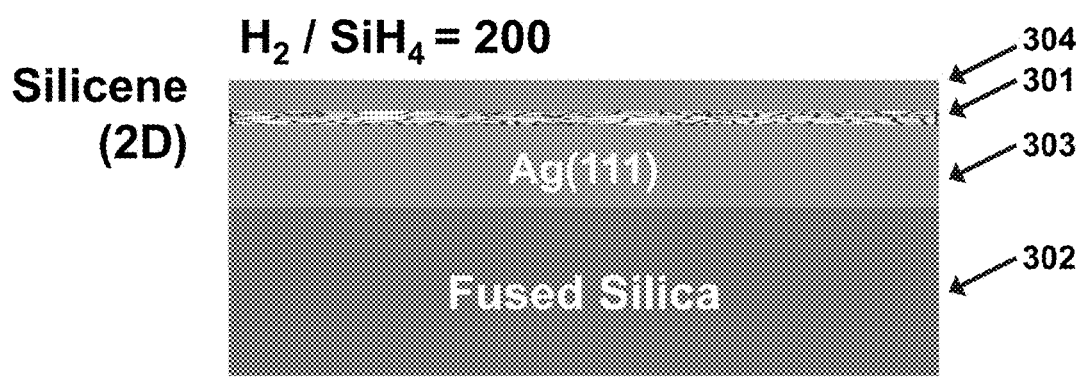
FIG. 3 is a block schematic illustrating aspects of an exemplary deposition of two-dimensional silicene on an Ag(111) film in accordance with the present invention.

FIGS. 2 and 3 illustrate differences between the nc-Si produced by PECVD in accordance with the '174 patent and the silicene films produced by PECVD in accordance with the present invention.

As shown in FIG. 2, nc-Si produced by PECVD in accordance with the method of the '174 patent is a three-dimensional film 201 deposited directly on a fused silica or single-crystal $Al_2O_3$ <0001> substrate 202. As described in detail in the '174 patent, the PECVD nc-Si film in accordance with Applicant's prior invention is produced using a starting mixture of hydrogen ($H_2$) and silane ($SiH_4$) in which $H_2$:$SiH_4$=100:1. By fixing the processing temperature at 250° C. and the pressure at 700 mTorr, the nc-Si can be grown to a uniform thickness of about 500 nm or more.

In contrast, as described in more detail below, the present invention provides a two-dimensional silicene layer 301, where the silicene layer is deposited on an Ag(111) film 303 situated on a fused silica substrate 302. The silicene layer 301 is capped by an $Al_2O_3$ layer 304 to protect it from oxidation damage caused by prolonged exposure to the ambient atmosphere.

Like the three-dimensional PECVD nc-Si according to the '174 patent, the two-dimensional PECVD silicene film in accordance with the present invention is produced from a starting mixture of $H_2$ and $SiH_4$. However, the silicene in accordance with the present invention is produced using twice as much $H_2$ as is used for production of nc-Si, i.e., $H_2:SiH_4=200:1$. This is a much higher hydrogen level than is used to produce nc-Si.

As a result, the process of the present invention produces a two-dimensional silicene that is naturally hydrogenated. No hydrogen is involved in the synthesis of silicene by MBE, and so hydrogenated silicene, often referred to as "silicane," cannot be produced directly using MBE, but instead is produced by means of a post-deposition decomposition of molecular hydrogen onto the silicene. See, e.g., J. Qiu, et al., "Ordered and Reversible Hydrogenation of Silicene," *Phys. Rev. Lett.* 114, 126101 (2015). In contrast, the silicane produced in accordance with the present invention is naturally hydrogenated and thus is more stable and less subject to oxidation than is silicane produced by conventional MBE processing. The hydrogen terminates the extra surface bond of each silicon atom and prevents the material from oxidation in ambient environment, making ex-situ capping of the silicene by $a-As_2O_3$ as described below possible. Silicane has been predicted to be semiconductor with a band gap ~3-4 eV as well as high carrier mobility, which is a great candidate as 2D field-effect transistor and also has great potential for optoelectronic and sensing applications. See L. C. Lew Yan Voon, et al, "Hydrogen compounds of group-IV nanosheets," *Appl. Phys. Lett.* 97, 163114 (2010); see also R. Zhang et al., "Silicane as an Inert Substrate of Silicene: A Promising Candidate for FET," *J. Phys. Chem. C* 2014, 118, 25278-25283.

Silicane is also an important candidate material for future hydrogen storage media due to its ability to undergo reversible hydrogenation. See J. Wang et al., "Hydrogen storage by metalized silicene and silicane," *Journal of Applied Physics* 114, 124309 (2013).

It has also been theoretically predicted that silicane displays ferromagnetism, which could be a very interesting material for spintronics. See C. Zhang et al., "First-Principles Study of Ferromagnetism in Two-Dimensional Silicene with Hydrogenation," *J. Phys. Chem. C,* 2012, 116 (6), pp 4163-4166. In contrast, MBE-grown non-hydrogenated silicene does not show any magnetism at all.

Thus, the process for producing silicene by means of PECVD in accordance with the present invention not only is simpler and less costly than conventional MBE processes currently in use, but it produces a naturally hydrogenated silicene having superior properties compared to silicene produced by conventional MBE processing.

Silicene can be formed in accordance with the process described herein using any suitable PECVD system, including the Nanofab and Plasma Pro-100 systems currently in use. Thus, as described in more detail below, in accordance with the present invention, silicene can be grown by means of PECVD from a starting mixture of $H_2$ and $SiH_4$ having an $H_2:SiH_4$ ratio of 100 to 400, with deposition being done on a substrate having a substrate temperature between 20° C. and 290° C., with the deposition being performed for about 10-25 minutes at an RF power between 10 W and 500 W, under a chamber pressure between about 100 mTorr and 1300 mTorr. By extending the time of the PECVD deposition process, e.g., past 25 minutes, multiple layers can be deposited to form a multi-layer silicene film. While higher $H_2:SiH_4$ ratios leads to better structural order, they also lead to high stress in the film, so that a $H_2:SiH_4$ ratio close to 200 is preferred and a longer deposition time is preferred in the process of the present invention to obtain the best quality silicene film.

The substrate temperature and RF power are highly interdependent, and the resulting silicene structure quality and the time needed to produce one monolayer can be sensitively affected by changes in temperature and/or power. It is therefore highly preferable to keep the substrate temperature between 200 and 290° C. and the power close to 50 W since lower temperatures and lower powers generally lead to amorphous or highly disordered structure, while power or temperatures that are too high can lead to defective silicene.

In addition, a stable and uniform plasma is required, which is mainly determined by chamber pressure. For the systems used in this invention, pressure between 100 mTorr and 1300 mTorr can be used, with 900 mTorr giving the best results.

The PECVD silicene in accordance with the present invention can be deposited on an Ag(111) surface. Ag(111) is suitable for the deposition of silicene because it has good lattice matching and a six-fold top-layer symmetry that can support the formation of honeycomb silicene growth.

It is well known that Ag grows in (111) preferred directions when films thickness is below 50-60 nm, and so the PECVD silicene can be deposited on an Ag(111) film grown on a substrate such as fused silica ($SiO_2$) or mica or on the surface of a bulk Ag(111) single crystal. In the case of Ag(111)-coated substrates, the Ag(111) can be deposited by any suitable method, e.g., sputtering, electron-beam evaporation, or atomic layer deposition to any suitable thickness. In addition, it is expected that other commonly used metal and semiconducting surfaces, such as Ir(111) and $ZrB_2$ (0001), Si(111), and $MoS_2$, that meets the surface lattice match requirements, might also be used for the growth of silicene, and in such cases, their semiconductor or insulating surfaces may facilitate immediate application of silicene-based devices.

The Ag(111)-coated substrates or bulk Ag(111) single crystals can be prepared in advance or obtained commercially and then transported to the reaction chamber for cleaning and annealing.

For example, Ag(111)-coated substrates used by the present inventors to demonstrate the processes of the present invention were prepared at the Naval Research Laboratory in Washington, D.C., with some of the films being prepared by sputtering and others being prepared by electron-beam deposition. The sputtered Ag(111) films were deposited using a three-step sputtering process involving a backsputter step, a presputter step, and a sputtering step. In the backsputtering step, once the chamber base pressure reached $7.4 \times 10^{-8}$ Torr and the fused silica substrate was at room temperature, the substrate was cleaned using an argon gas flow of 25 sccm, RF power of 25 W and pressure of 20 mTorr for 5 minutes. The substrate was then subjected to presputtering of an argon gas flow at 25 sccm under an RF power of 200 W and a pressure of 2 mTorr for 5 minutes, and then finally, the shutter was opened for 10 seconds to sputter the silver film as the substrate rotated at 20 rpm under the same conditions as for the presputtering step described above.

The Ag(111) films prepared by electron-beam deposition were also prepared with the fused silica substrate at room temperature, with the deposition being performed at a base pressure of $2\times10^{-7}$ Torr and a deposition rate of 0.1 nm/sec to produce a film thickness of 20 nm.

EXAMPLES

As a proof-of-concept regarding the formation of silicene by PECVD on an Ag(111) film, the inventors demonstrated that formation of silicene by means of PECVD in accordance with the present invention could be accomplished according to one of two different PECVD processes described below. These processes were demonstrated in two different PECVD systems, the Nanofab and Plasma Pro-100 PECVD systems at Oxford Instruments in the United Kingdom, with the variations in processing parameters reflecting the conditions of each such system.

The substrate temperature of Nanofab system is able to go up 1200° C., while the substrate temperature of Plasma Pro-100 system is only limited to 400° C. Although both systems can be used to prepare silicene in accordance with the process of the present invention, as discussed in more detail below, the Raman images of the silicene films show more pronounced defect peaks, not seen in perfect silicene, in films prepared by Plasma Pro-100 than by Nanofab, indicating that higher quality silicene was formed in samples prepared by Nanofab system.

Example 1—Nanofab

Before deposition of the silicene using the Nanofab system, the Ag(111) film is cleaned and annealed in-situ at 500-600° C. in the Nanofab chamber, following the steps and under the processing conditions set forth below:

STEP 1: Ag(111)-coated fused silica substrate was placed into the Nanofab system. The system was then pumped down to a pressure of $2\times10^{-7}$ Torr for 10 minutes. An $N_2$ flow into the chamber was set at a flow rate of 1000 sccm at a chamber pressure of 1500 mTorr, with the substrate being heated to a temperature of 250° C. for 30 minutes. Then purge $N_2$ from the chamber.

STEP 2: After the $N_2$ gas was purged, Ar was introduced into the chamber at a flow rate of 1000 sccm, a pressure of 900 mTorr, and a power at 0 W for 2 minutes for preparation of Ar plasma.

STEP 3: The RF power was set at 500 W to generate an Ar plasma treatment to the substrate at an Ar flow rate of 1000 sccm, a pressure of 900 mTorr, and a temperature at 250° C. for 15 minutes.

STEP 4: The power and gas flow were turned off, setting the Ar flow at 0 sccm and the pressure at 0 mTorr, with the substrate temperature being held at 250° C. for 1 minute.

STEP 5: To anneal the substrate at a high temperature, the substrate temperature was increased to 550° C. and held for 30 minutes in an inert condition under an Ar flow rate of 1000 sccm, a power at 0 W and a chamber pressure of 900 sccm.

STEP 6: Start plasma with RF power of 90 W. The substrate was treated in the Ar plasma for 25 minutes under an RF power of 90 W, a substrate temperature of 550° C. and a chamber pressure of 900 mTorr.

STEP 7: The power and Ar gas flow were then turned off and the substrate held at 550° C. for 1 minute.

STEP 8: The chamber was then cooled to 250° C. under vacuum at $3\times10^{-7}$ Torr and the substrate held in the chamber for 35 minutes for temperature stabilization.

Once the Ag(111) substrate was cleaned/annealed as set forth above, the silicene was then deposited on the substrate by means of standard PECVD processing, using a mixture of hydrogen and silicene having a ratio $H_2$:$SiH_4$ of 200:1, with deposition being performed at an RF power of 50 W, a chamber pressure of 900 mTorr, a deposition temperature of 250° C. and a deposition time of 10-20 minutes. As noted above, by extending the time of the PECVD deposition process beyond 20 minutes in the Nanofab system, multiple layers of silicene can be deposited to form a multi-layer silicene film.

Example 2—Plasma Pro-100

In a second example, the Ag(111) wafer was annealed and the silicene deposited in a Plasma Pro-100 PECVD chamber. Unlike the Nanofab system, the Plasma Pro-100 has a maximum heating temperature of 400° C.; as a result, although annealing of Ag(111) at 400° C. is possible, it may not be ideal in terms of surface cleaning, oxidation removal and improving (111) structural order, and so it may be preferred to use pre-cleaned/annealed Ag(111) wafers if deposition of silicene in a system such as the Plasma Pro-100 is to be done.

If cleaning/annealing of the Ag(111) wafers in the Plasma Pro-100 system is desired, it can be accomplished in-situ in the Plasma Pro-100 chamber following the steps and under the processing conditions set forth below:

STEP 1: Ag(111)-coated fused silica substrate was placed into the Plasma Pro-100 system. The system was then pumped down to a pressure of $5\times10^{-7}$ Torr for 10 minutes. An $N_2$ flow into the chamber was set at a flow rate of 1000 sccm at a chamber pressure of 1500 mTorr, with the substrate being heated to a temperature of 250° C. for 30 minutes. Then purge $N_2$ from the chamber.

STEP 2: After the $N_2$ gas was purged, Ar was introduced into the chamber at a flow rate of 1000 sccm, a pressure of 900 mTorr, and a power at 0 W for 2 minutes for preparation of Ar plasma.

STEP 3: The RF power was set at 500 W to generate an Ar plasma treatment to the substrate at an Ar flow rate of 1000 sccm, a pressure of 900 mTorr, and temperature of 250° C. for 15 minutes.

STEP 4: The power and gas flow were turned off, setting the Ar flow at 0 sccm and a pressure at 0 mTorr, with the substrate temperature being held at 250° C. for 1 minute.

STEP 5: To anneal the substrate at a high temperature, the substrate temperature was increased to 390° C. for 30 minutes in an inert condition under an Ar flow rate of 1000 sccm, a power at 0 W, and a chamber pressure of 900 mTorr.

STEP 6: Start plasma with RF power of 90 W. The substrate was treated in the Ar plasma for 25 minutes under an RF power of 90 W, a substrate temperature of 390° C., and a chamber pressure at 900 mTorr.

STEP 7: The power and the Ar gas flow were then turned off and the substrate held at 390° C. for 1 minute.

STEP 8: The chamber was then cooled to 250° C. under vacuum at $3\times10^{-6}$ Torr and the substrate held in the chamber for 35 minutes for temperature stabilization.

Once the Ag(111) substrate was cleaned/annealed as set forth above, the silicene was then deposited on the substrate in the Plasma Pro-100 chamber by means of standard PECVD processing, using a mixture of hydrogen and silicene having a ratio $H_2$:$SiH_4$ of 200:1, with deposition being performed at an RF power of 90 W, a chamber pressure of 700 mTorr, a deposition temperature of 250° C., and a deposition time of 10-25 min. As noted above, by extending the time of the PECVD process beyond the initial 25 minutes in the Plasma Pro-100 system, multiple layers of silicene can be deposited to form a multi-layer silicene film.

Irrespective of the deposition conditions, silicene can be easily oxidized when exposed to air for extended period of time. Studies show that exposure to air for 24 hours resulted in almost complete oxidation of monolayer silicene. See Yi Du et al., "Tuning the Band Gap in Silicene by Oxidation," *ACS Nano* 8, 10019 (2014). Consequently, encapsulation or capping is required before monolayer silicene can be examined or used outside the deposition chamber. For the first reported MBE-silicene-based field effect transistor, the ambipolar transport behavior lasted for about 40 seconds, then it degrades within 2 minutes when exposed to air, see Supplementary information of Li Tao et al., "Silicene field-effect transistors operating at room temperature," *Nature Nanotech* 10, 227 (2015).

The ideal way in which to protect a silicene film would be an in-situ deposition of an $Al_2O_3$ capping layer immediately following the silicene deposition. However, this is not possible in most PECVD systems because of the absence of an Al precursor in most PECVD systems, including the Nanofab and Plasma Pro-100 systems used by the inventors, and consequently, it will often be necessary to remove the Ag(111) or other substrate wafers that have been freshly deposited with silicene from the PECVD chamber and transfer them to another deposition system for ex situ deposition of a capping layer, typically $Al_2O_3$ deposited in an ALD chamber. While ALD deposition of a capping layer on silicene has also been used for silicene films produced by MBE, see Alessandro Molle et al., "Hindering the Oxidation of Silicene with Non-Reactive Encapsulation," *Adv. Func. Mater.* 23, 4340 (2013), such capping has only been performed in-situ, and never ex situ as in the process of the present invention. However, as noted above, the hydrogenated silicene produced by the PECVD process in accordance with the present invention is more stable and so can be exposed to the ambient for a longer period of time without harmful oxidation, enabling the ex situ deposition of the capping layer.

Thus, in the exemplary cases examined by the inventors of the present invention, the silicene-coated wafers were transferred from the PECVD systems in which the silicene was deposited to a separate atomic layer deposition (ALD) system for $Al_2O_3$ capping of the silicene film. During this transfer process, the freshly deposited silicene films were exposed to the ambient atmosphere for about 4-6 minutes. The ALD $Al_2O_3$ capping layer can be deposited using any standard recipe suitable for the ALD system used; in the examples examined by the present inventors, the $Al_2O_3$ capping layer was deposited to a thickness of about 20 nm, with the capping procedure taking about 20 minutes. As described in more detail below, the $Al_2O_3$-capped PECVD silicene films produced in accordance with the present invention did not exhibit any negative effects from their exposure to air during this ex situ capping procedure.

The PECVD process of the present invention can be upscaled more easily and less expensively to produce large wafer-size silicene-coated substrates suitable for use in commercial processing than a MBE system can. This represents a significant advantage over conventional MBE processing. In addition, PECVD, as a standard wafer-scale semiconductor process tool, does not require UHV condition for deposition and saves processing time that will be required for reaching UHV in MBE systems.

Figure 4:
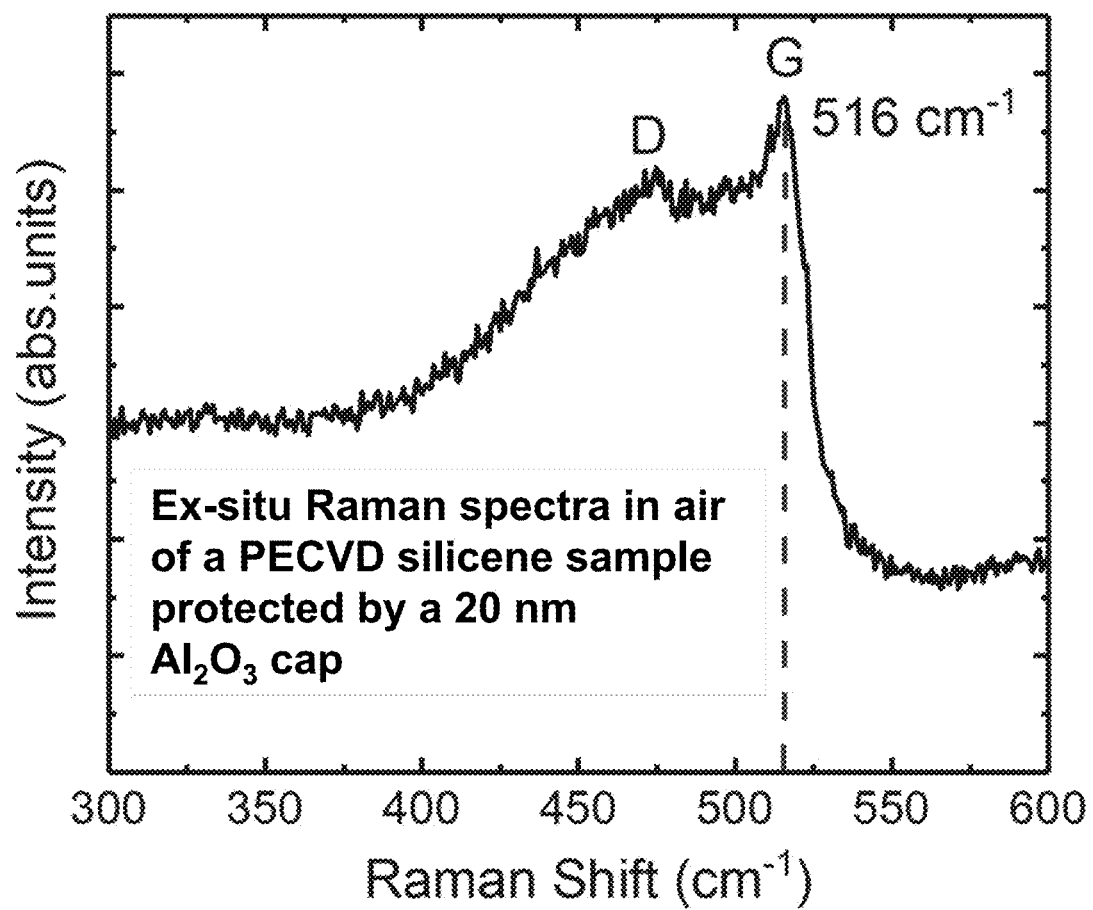
FIG. 4 is a plot illustrating the results of an ex-situ Raman spectra of a PECVD silicene sample having a 20 nm-thick $Al_2O_3$ cap produced in accordance with the present invention.

FIG. 4 is a Raman spectrum of a sample of PECVD silicene grown on a 20 nm-thick Ag(111) surface that has been capped with a layer of a-$Al_2O_3$ ex situ in the manner described above. As can be seen from the FIGURE, the Raman spectrum of this sample shows a signature G peak at 516 $cm^{-1}$, which is attributed to a doubly degenerate E2g mode originated from the Si—Si bond stretching in the honeycomb lattice of silicene. It is considered a characteristic feature of silicene. The peak labelled "D" is a defect peak not seen in perfect silicene, which varies in size and shape depending on the structure quality of the material. Raman spectra of MBE silicene vary in shape and peak locations. The Raman spectra of PECVD silicene are quite similar to and in the range of those of MBE silicene.

Figure 5A:
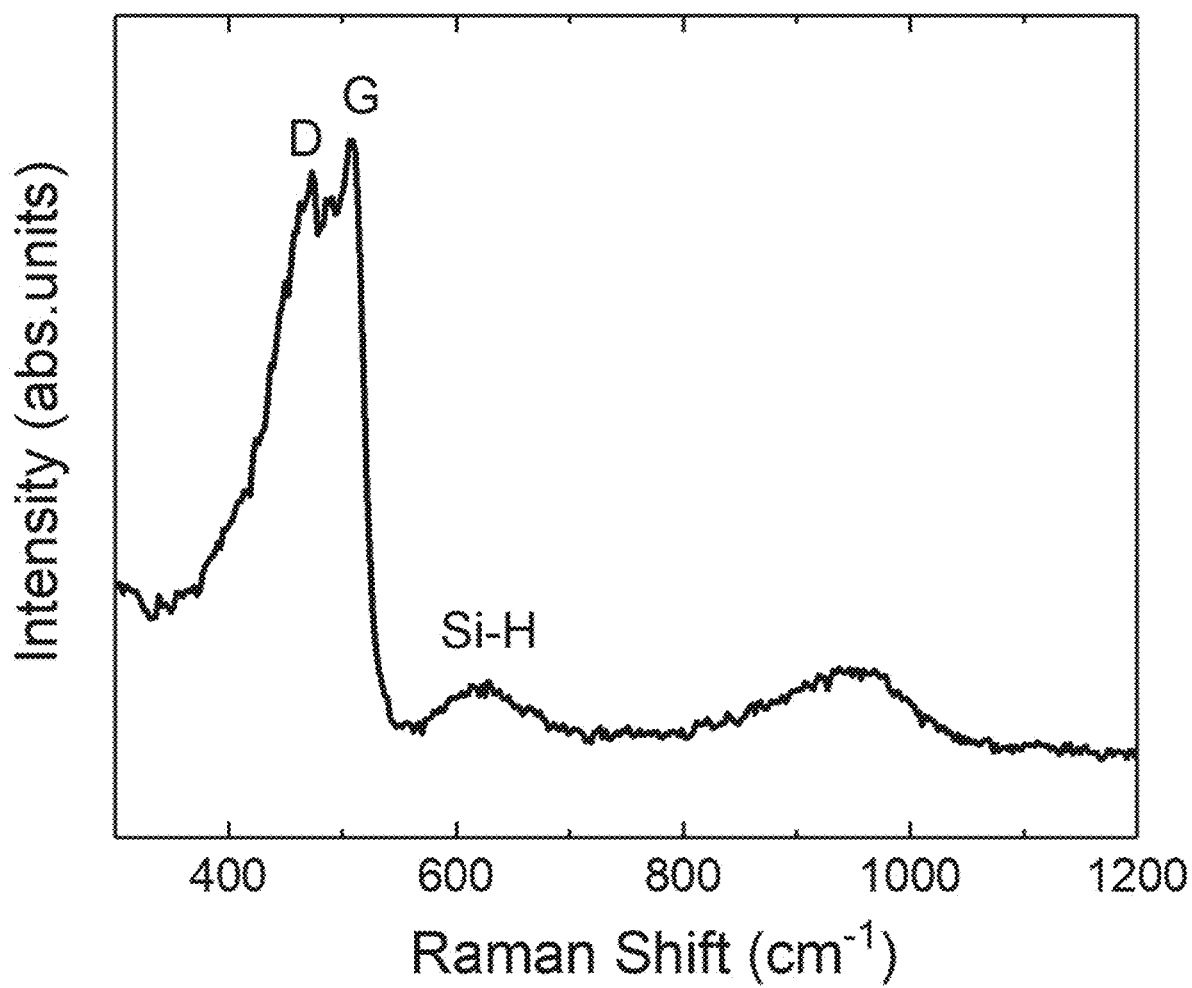
FIGS. 5A and 5B are plots illustrating the results of a Raman spectra showing the hydrogenated nature of a PECVD silicene sample produced in accordance with the present invention.
Figure 5B:
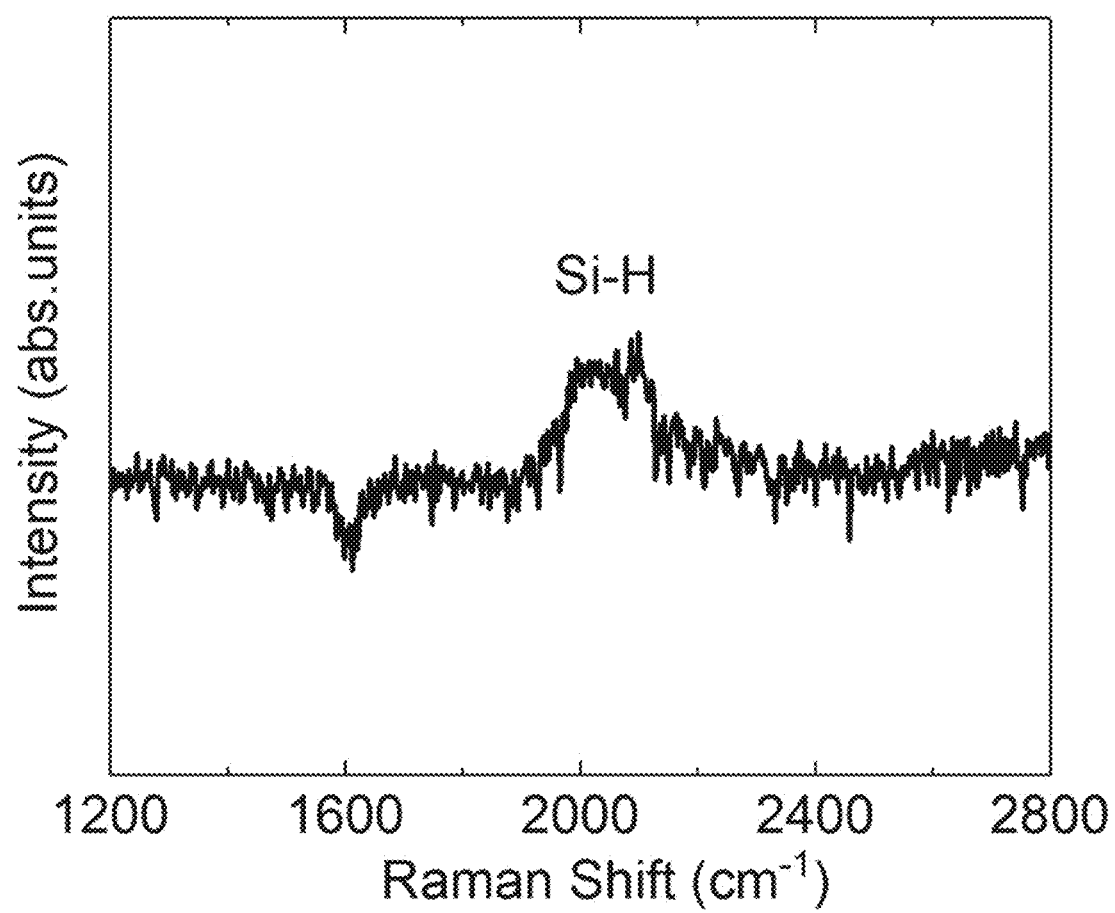

FIGS. 5A and 5B also present Raman spectra of a sample of PECVD silicene grown in the manner described above focusing on the spectra above G and D peaks. The peaks labelled "Si—H" in FIGS. 5A and 5B, respectively, are the first and second order Si—H wagging modes. They are commonly seen in hydrogenated amorphous and nanocrystalline silicon. Note that the Si—H peaks of the PECVD silicene film do not exist in MBE silicene as they are a convincing evidence of hydrogenation FIGS. 6 and 7 show the results of X-ray diffraction (XRD) studies of the Ag film on which the PECVD silicene is formed in accordance with the present invention and of the PECVD silicene layer itself.

Figure 6:
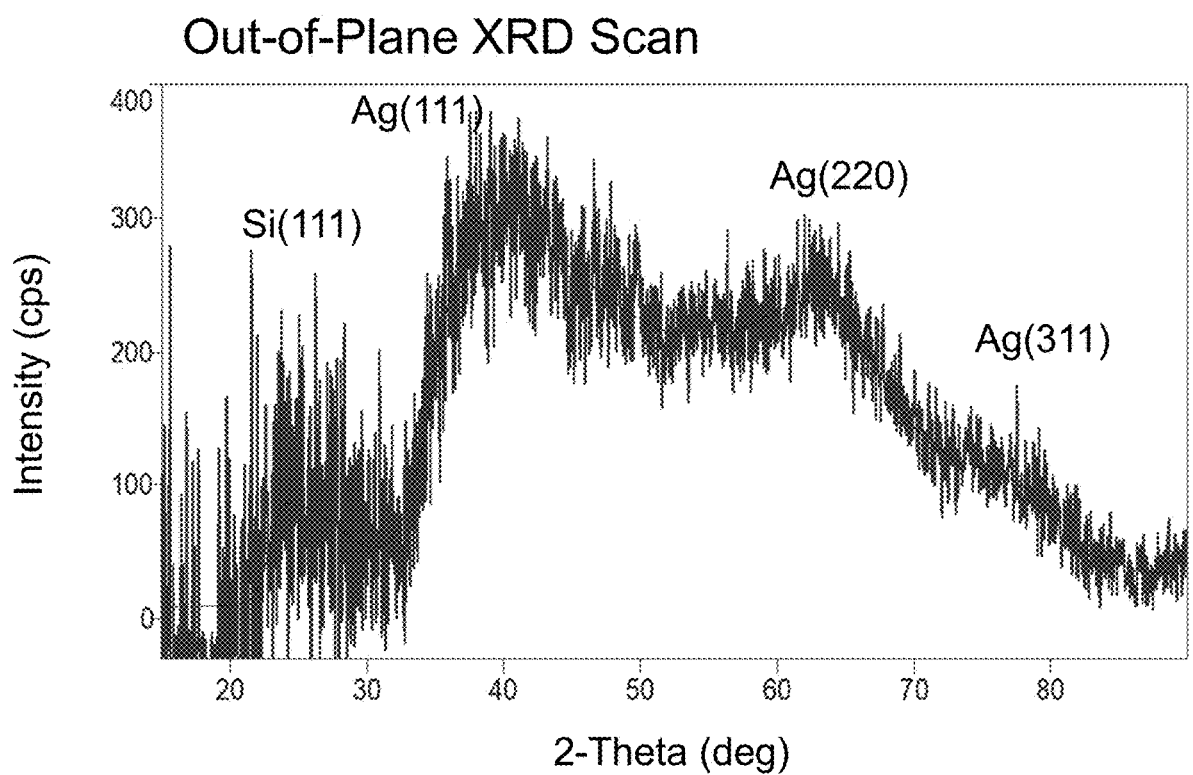
FIG. 6 shows the results of an out-of-plane XRD study of an Ag film on which PECVD silicene was deposited in accordance with the present invention and shows that Ag(111) is the dominant orientation of an Ag film sputtered on a fused silica substrate. The weak Si(111) peak originates from the partial interlayer scattering of silicene.

Thus, the XRD plot in FIG. 6 shows the results of the diffraction produced by an out-of-plane X-ray with a grazing incidence on a 20 nm-thick silver film that was sputtered on a fused silica substrate, and shows that the Ag(111) plane is the dominant plane in such a film. The weak Si(111) comes from interlayer scattering of silicene.

Figure 7:
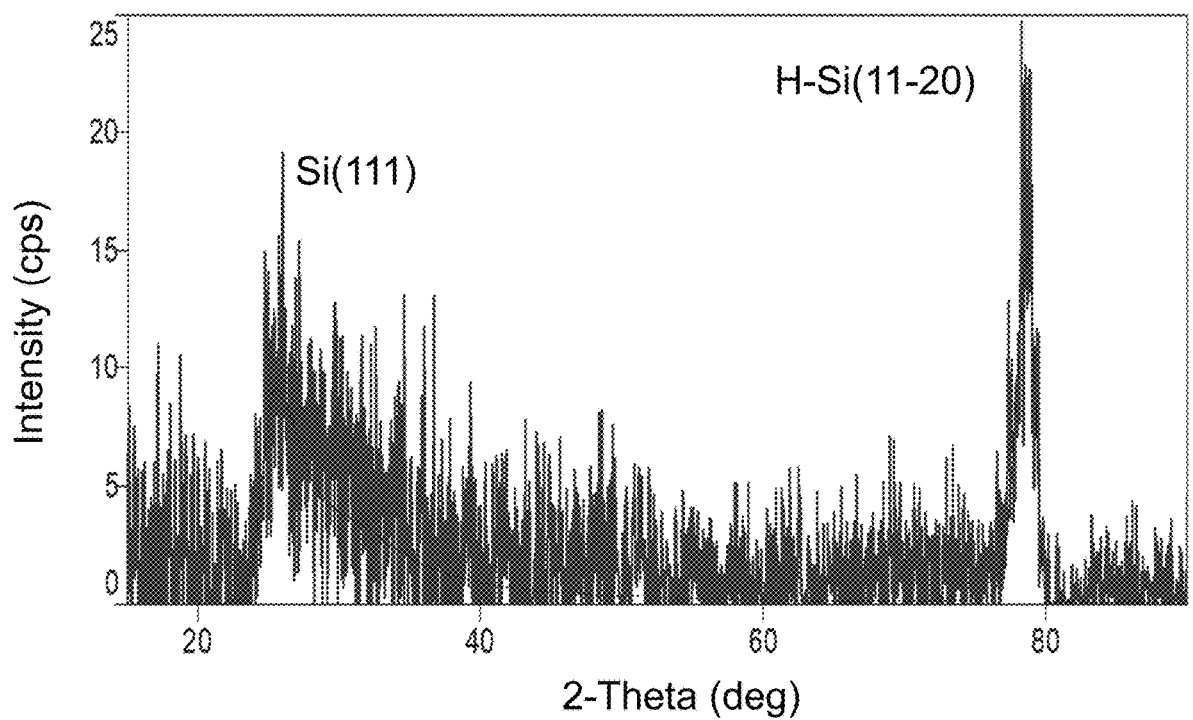
FIG. 7 shows the results of an in-plane XRD study of a PECVD silicene sample produced in accordance with the present invention, where the weak Si(111) peak has the same origin as seen in FIG. 6 and the H—Si(11-20) peak comes from the honeycomb silicene structure.

FIG. 7 shows the results of an in-plane XRD study of a PECVD silicene sample produced in accordance with the present invention, where the weak Si(111) peak has the same origin as seen in FIG. 6 and the H—Si peak comes from the honeycomb silicene structure. The XRD plot in FIG. 7 shows the results of the diffraction produced by an in-plane X-ray incident on a sample of PECVD silicene produced on an Ag(111) silver film in accordance with the present invention. As can be seen from the XRD plot shown in FIG. 7, the in-plane XRD study of the silicene sample reveals that the sample has a strong (H—Si(11-20)) signal associated with a hexagonal structure and a weaker (but still visible) Si(111) signal associated with a 3D structure, representing a layered silicene. Note that the Si(111) signal is also seen in FIG. 6. The c-axis lattice constant for silicene is estimated to be 6.9 Angstroms, and using the Sherrer equation well known in the art, we estimated the d-spacing of this sample of PECVD silicene has approximately 1.3 layers, demonstrating it is mostly monolayer.

Figure 8A:
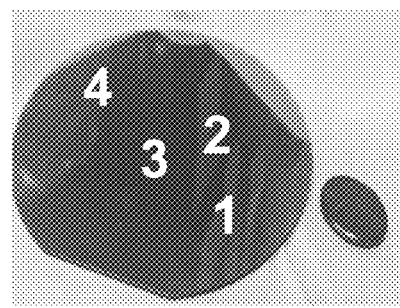
FIGS. 8A and 8B illustrate aspects of a Raman spectra collected on four different locations of a 4-inch wafer-scale PECVD silicene sample produced in accordance with the present invention.
Figure 8B:
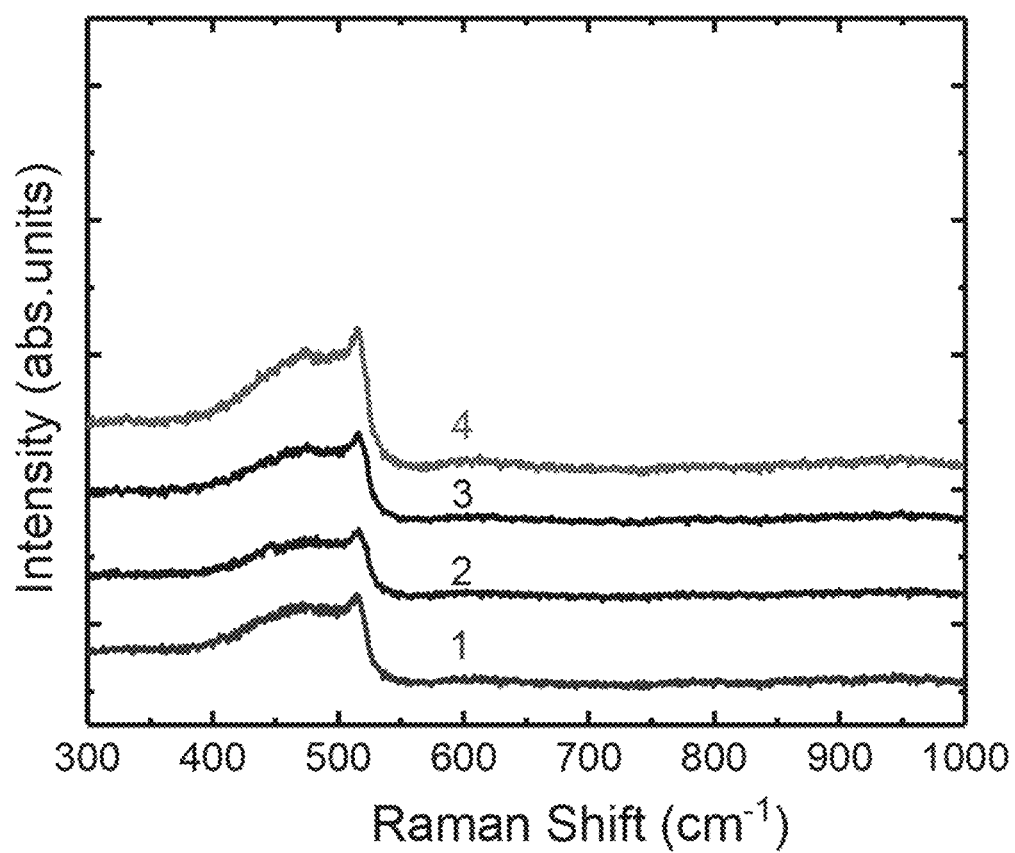

FIGS. 8A-8B illustrate the uniformity of the PECVD silicene produced in accordance with the present invention. As noted above, the PECVD process in accordance with the present invention can produce silicene-coated wafers on the scale of 4 inches in diameter or more, as illustrated by the image shown in FIG. 8A, which shows a PECVD silicene wafer next to a U.S. penny for size comparison. FIG. 8B illustrates the results of Raman spectra obtained at four different locations (1, 2, 3, 4) on the 4-inch PECVD silicene wafer sample shown in FIG. 8A. As can be seen from the Raman spectra shown in FIG. 8B, which shows the same peak for each of the four locations on the wafer, the thickness and phase of the silicene at all four locations is the same, showing that the silicene is uniform over the entire surface of the wafer.

Figure 9:
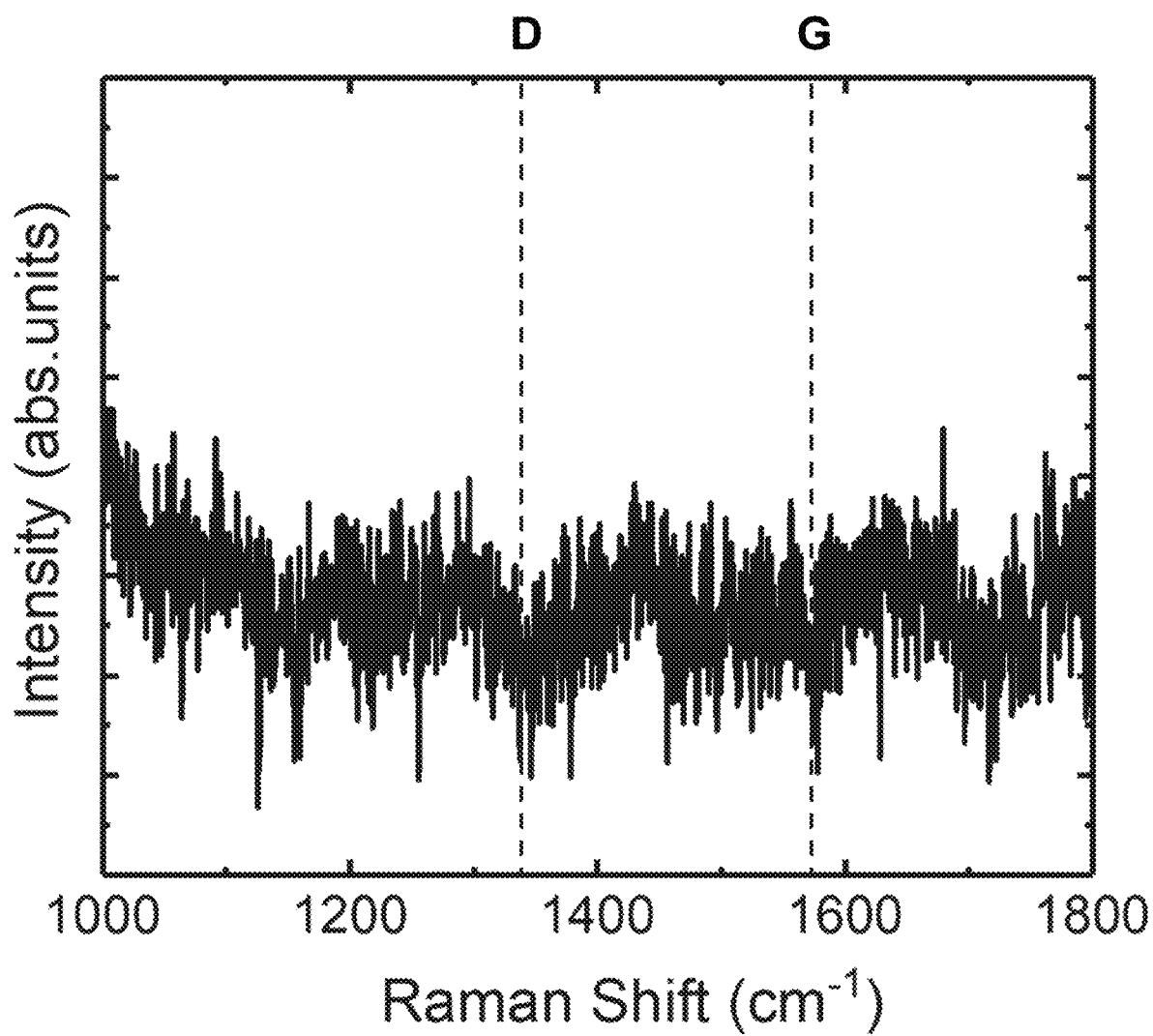
FIG. 9 illustrates aspects of a Raman spectra collected on a PECVD silicene sample which shows the absence of contamination by carbon atoms on the surface of the silicene sample.

In addition, the inventors of the present invention performed a Raman analysis on the sample to confirm that it was free of carbon contamination. The results of this analysis are shown in FIG. 9. Although XRD data such as those illustrated in FIGS. 6 and 7 discussed above show the crystalline structure of sample, i.e., that the silver film has a Ag(111) orientation or the PECVD silicene has a hexagonal (H—Si(11-20) structure, such analysis does not tell chemically what the atoms are that show such a hexagonal structure. Raman peaks at ~1350 cm$^{-1}$ and 1582 cm$^{-1}$, known as D and G bands, respectively, for graphene, show the presence of carbon in the sample. See L. M. Malard, M. A. Pimenta, G. Dresselhaus, and M. S. Dresselhaus, "Raman spectroscopy in graphene," *Physics Reports* 473 (2009). The Raman analysis done for FIG. 9 shows no active first order Raman signal of C—C bonds at ~1350 cm$^{-1}$ or ~1587 cm$^{-1}$, thus showing no contamination of carbon atoms that may contribute to the observed H—Si(11-20) peak.

To further confirm the absence of carbon atoms, the inventors also performed X-ray photoelectron spectroscopy (XPS) analysis on the silicene sample.

Figure 10:
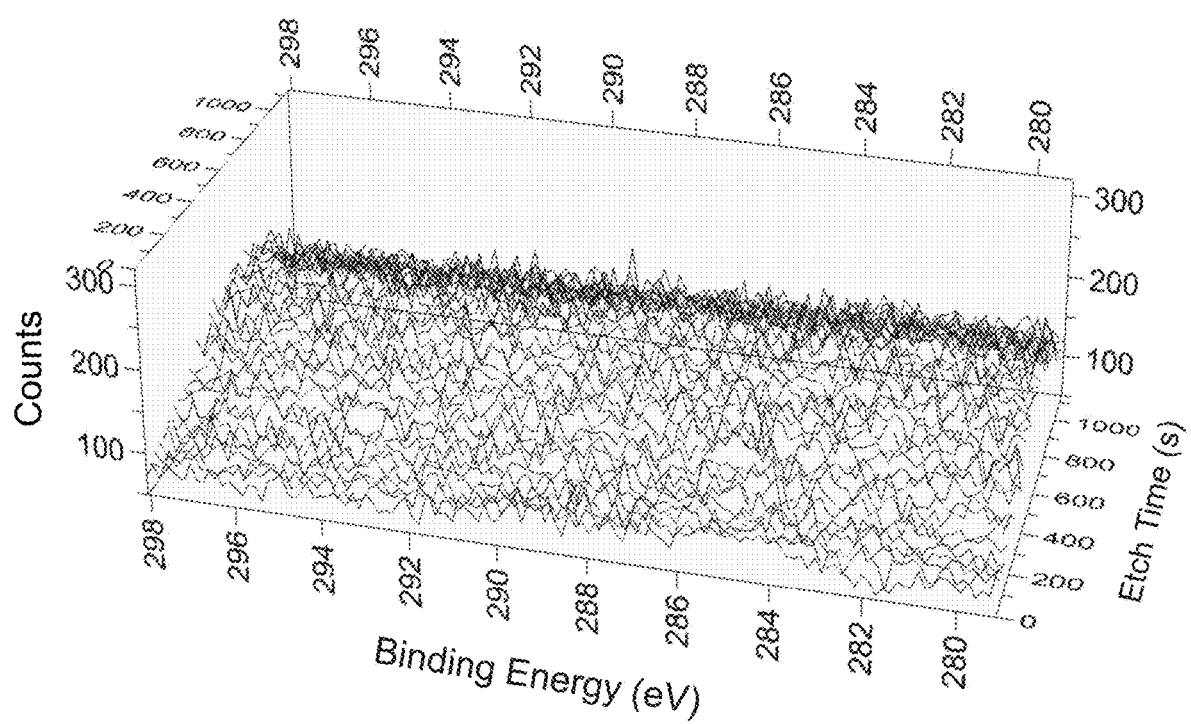
FIG. 10 is a plot illustrating the results of XPS spectra of a carbon is scan performed on a PECVD silicene sample produced in accordance with the present invention.

FIG. 10 presents the results of a carbon is scan of XPS performed on a PECVD silicene sample prepared in accordance with the present invention. The binding energies of 1 s C—C, C—O, and C—O═O bonds in the sample are positioned at 284.8 eV, ~286 eV and 288.5 eV respectively. As can be seen in FIG. 10, there is no sign of carbon within the resolution of the technique. This result agrees with the Raman spectra results where we did not observe C—C bond vibrations.

Figure 11A:
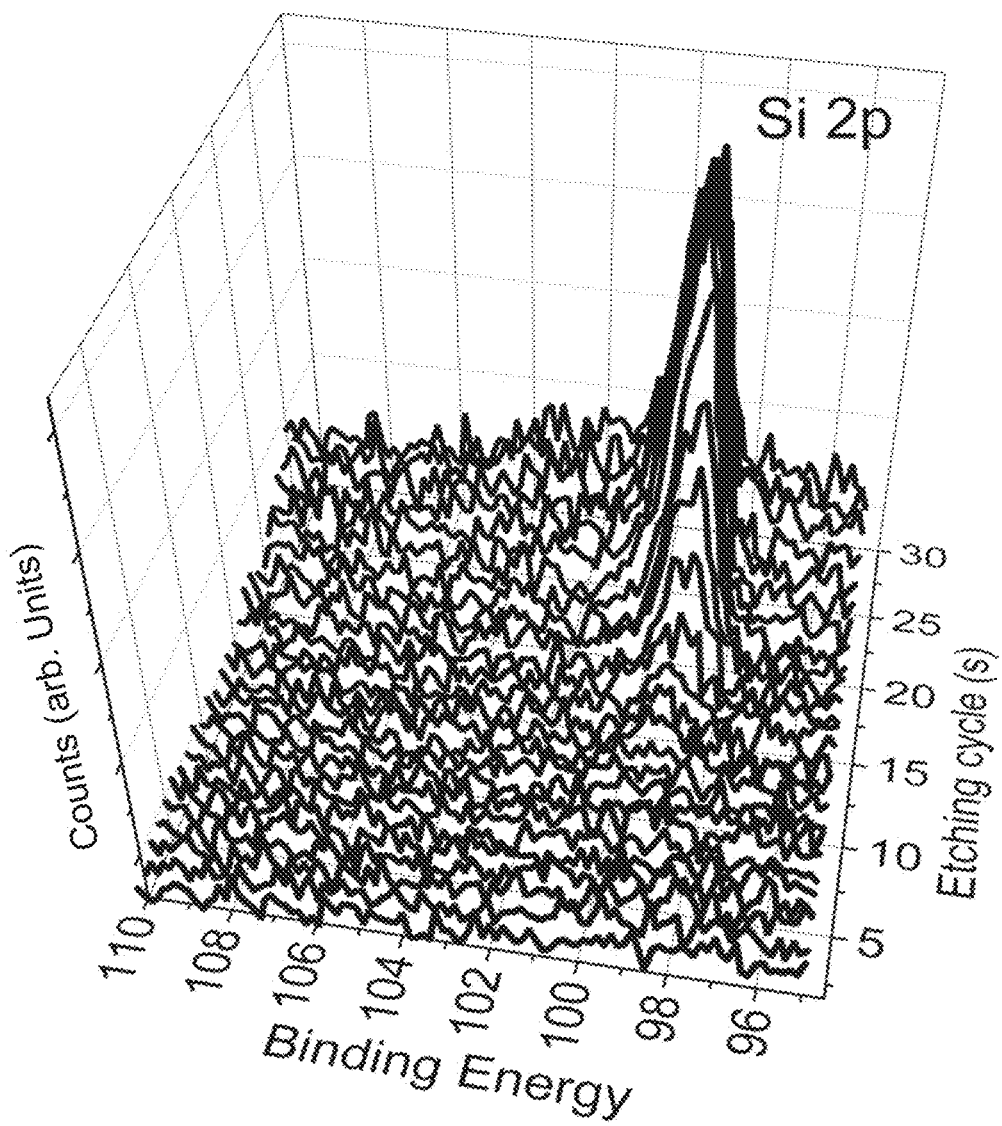
FIGS. 11A and 11B are plots depicting the results of XPS spectra examination of a PECVD silicene sample produced in accordance with the present invention.
Figure 11B:
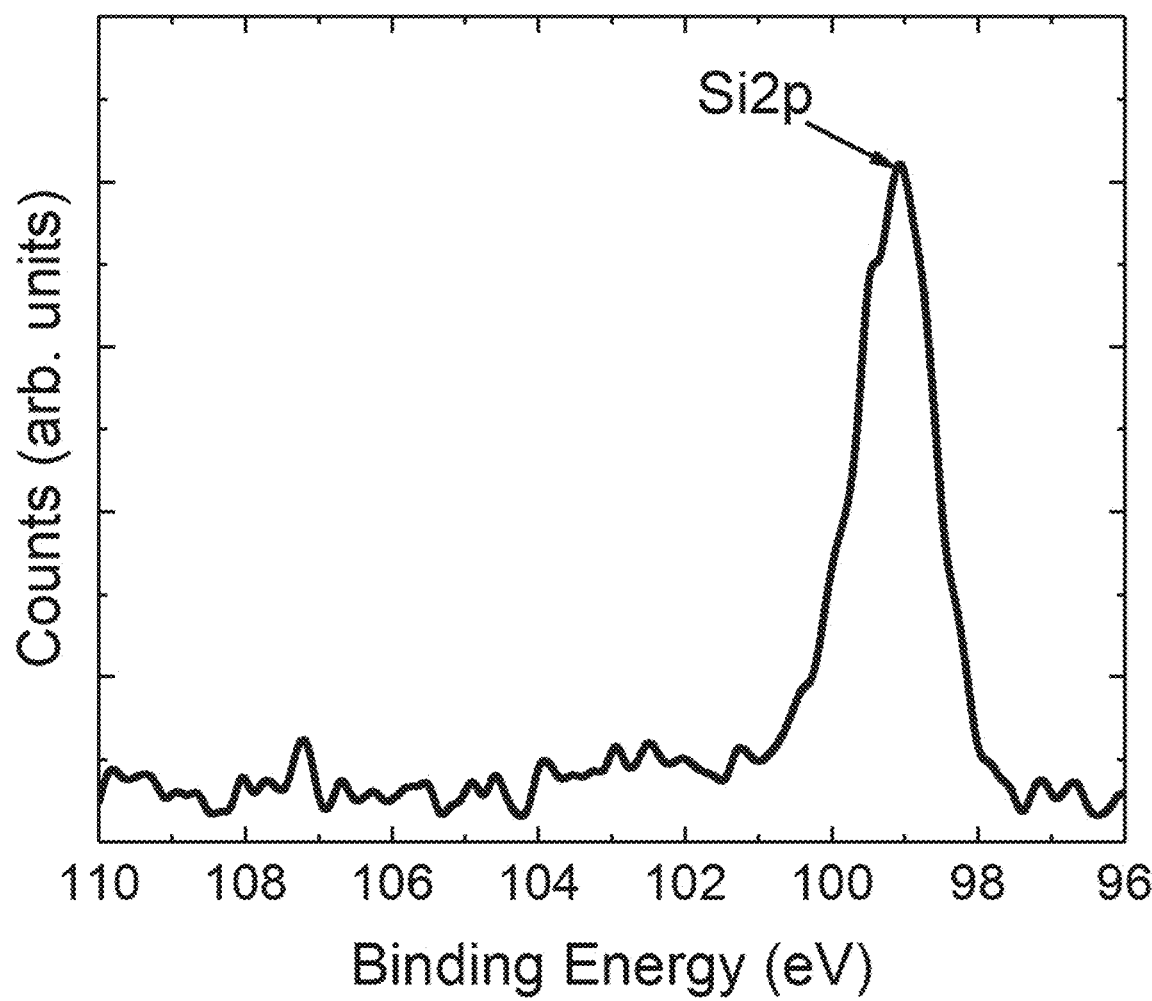

FIGS. 11A and 11B further illustrate the desirable characteristics of a-Al$_2$O$_3$-capped PECVD silicene produced in accordance with the present invention, with FIG. 11A showing the etching time dependent spectrum and FIG. 11B showing the spectrum at an etching time of 30 seconds. Both focus on the silicon signal.

As described above, in contrast to conventional MBE-based silicene deposition processes, in which an a-Al$_2$O$_3$ cap is applied in-situ, without the silicene being exposed to the atmosphere before being capped, in the method of the present invention, the Al$_2$O$_3$ cap is applied ex situ. In the example examined for FIGS. 11A and 11B, a PECVD silicene sample was exposed to air for about 4-6 minutes while being transferred from the PECVD chamber to the ALD chamber for deposition of a 20 nm-thick Al$_2$O$_3$ cap. As shown by the XPS spectra in FIGS. 11A and 11B, the capped PECVD sample shows no sign of oxidation of the silicene. The peak at a binding energy (BE) of 98.8 eV comes from Si 2p line related to elemental silicene. If oxidation happens, a peak coming from Si—O bonding component at BE-102.3 eV should become observable. As a result of these experiments, it is believed that the hydrogenated silicene produced by the PECVD method of the present invention could be more oxygen-resistant than silicene produced by conventional MBE methods, since such silicene oxidizes within 2 minutes when exposed in air.

Advantages and New Features

The present invention produces high-quality silicene having structure quality comparable to that produced by conventional MBE processing, but in a PECVD process that is simpler and less restrictive than for MBE. The PECVD process in accordance with the present invention is not only more efficient and cost effective than MBE, but is also more compatible to wafer scale microelectronics production than MBE growth process. The ability to deposit monolayer silicene by PECVD demonstrated in this disclosure would open up the opportunity to produce this 2-dimensional material in large scale inexpensively, which could expedite the application of silicene based technology in an industrial scale. PECVD silicene-based nano/microelectronics with ultimate high density, high efficiency and low power consumption could revolutionize many of the technological areas. More structural and electronic property characterizations will be performed to compare PECVD silicene with conventional MBE silicene and to improve its quality.

Alternatives

Other deposition systems or deposition parameters may be used to produce silicene films having desired structural and electronic property characterizations. In addition, it is also possible to form silicene on other metal or semiconductor materials such as Ir(111) and ZrB$_2$(0001), Si(111), and MoS$_2$ films deposited on an underlying substrate. In addition, other capping layers, such as AlN, would also be possible. It is also possible for silicene to be grown by other CVD techniques, similar to the case of graphene. Extension of this work to cover those mentioned above will help accommodate various device fabrication requirements for future applications.

Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. A process for making a naturally hydrogenated silicene film, comprising the steps of:
    placing a substrate into a plasma-enhanced chemical vapor deposition (PECVD) chamber;
    setting the substrate to a temperature of about 20 to about 290° C.;
    providing a starting material comprising a mixture of H$_2$ and SiH$_4$ having an H$_2$:SiH$_4$ ratio between 100:1 and 400:1; and
    depositing a two-dimensional silicene film on the substrate from the H$_2$:SiH$_4$ starting material by means of PECVD, deposition occurring for about 10 to 25 minutes at an RF power of about 10 W to about 90 W and a chamber pressure of about 100 mTorr to about 1300 mTorr.

2. The process for making a naturally hydrogenated silicene film according to claim 1, wherein the starting material has an H$_2$:SiH$_4$ ratio of 200:1.

3. The process for making a naturally hydrogenated silicene film according to claim 1, wherein the substrate comprises an Ag(111) film on a substrate.

4. The process for making a naturally hydrogenated silicene film according to claim 1, wherein the substrate comprises an Ag(111) film sputtered or electron-beam evaporated on a fused silica substrate.

5. The process for making a naturally hydrogenated silicene film according to claim 1, wherein the substrate comprises an Ir(111), ZrB$_2$(0001), Si(111), or MoS$_2$ film.

6. The process for making a naturally hydrogenated silicene film according to claim 1, wherein the starting mixture has an H$_2$:SiH$_4$ ratio of 200:1 and the deposition is performed at an RF power of 50 W, a chamber pressure of 900 mTorr, a deposition temperature of 250° C., and a deposition time of 10-20 minutes.

7. The process for making a naturally hydrogenated silicene film according to claim 1, wherein the starting mixture has an $H_2:SiH_4$ ratio of 200:1 and the deposition is performed at an RF power of 90 W, a chamber pressure of 700 mTorr, a deposition temperature of 250° C., and a deposition time of 10-25 min.

8. The process for making a naturally hydrogenated silicene film according to claim 1, further comprising the steps of:
   cleaning the substrate in the PECVD chamber; and
   annealing the substrate in the PECVD chamber at a temperature of about 390° C. to about 550° C.

9. The process for making a naturally hydrogenated silicene film according to claim 8, wherein the capping layer comprises $Al_2O_3$.

10. The process for making a naturally hydrogenated silicene film according to claim 8, wherein the capping layer comprises AlN.

11. The process for making a naturally hydrogenated silicene film according to claim 1, further comprising removing the substrate with the deposited silicene film from the PECVD chamber and transferring it to an atomic layer deposition (ALD) chamber; and
   depositing a capping layer on an upper surface of the silicene film by means of ALD in the ALD chamber.

12. The naturally hydrogenated silicene film produced by the process of claim 1.

13. A process for making a naturally hydrogenated silicene film, comprising the steps of:
   placing a substrate into a plasma-enhanced chemical vapor deposition (PECVD) chamber;
   setting the substrate to a temperature of about 20 to about 290° C.;
   providing a starting material comprising a mixture of $H_2$ and $SiH_4$ having an $H_2:SiH_4$ ratio between 100:1 and 400:1; and
   depositing a two-dimensional silicene film on the substrate from the $H_2:SiH_4$ starting material by means of PECVD, deposition occurring for about 10 to 25 minutes at an RF power of about 10 W to about 500 W and a chamber pressure of about 100 mTorr to about 1300 mTorr.

14. The process for making a naturally hydrogenated silicene film according to claim 13, wherein the starting material has an $H_2:SiH_4$ ratio of 200:1.

15. The process for making a naturally hydrogenated silicene film according to claim 13, wherein the substrate comprises an Ag(111) film on a substrate.

16. The process for making a naturally hydrogenated silicene film according to claim 13, wherein the substrate comprises an Ag(111) film sputtered or electron-beam evaporated on a fused silica substrate.

17. The process for making a naturally hydrogenated silicene film according to claim 13, wherein the substrate comprises an Ir(111), $ZrB_2$(0001), Si(111), or $MoS_2$ film.

18. The process for making a naturally hydrogenated silicene film according to claim 13, wherein the starting mixture has an $H_2:SiH_4$ ratio of 200:1 and the deposition is performed at an RF power of 50 W, a chamber pressure of 900 mTorr, a deposition temperature of 250° C., and a deposition time of 10-20 minutes.

19. The process for making a naturally hydrogenated silicene film according to claim 13, wherein the starting mixture has an $H_2:SiH_4$ ratio of 200:1 and the deposition is performed at an RF power of 90 W, a chamber pressure of 700 mTorr, a deposition temperature of 250° C., and a deposition time of 10-25 min.

20. The process for making a naturally hydrogenated silicene film according to claim 13, further comprising the steps of:
   cleaning the substrate in the PECVD chamber; and
   annealing the substrate in the PECVD chamber at a temperature of about 390° C. to about 550° C.

21. The process for making a naturally hydrogenated silicene film according to claim 20, wherein the capping layer comprises $Al_2O_3$.

22. The process for making a naturally hydrogenated silicene film according to claim 20, wherein the capping layer comprises AlN.

23. The process for making a naturally hydrogenated silicene film according to claim 13, further comprising removing the substrate with the deposited silicene film from the PECVD chamber and transferring it to an atomic layer deposition (ALD) chamber; and
   depositing a capping layer on an upper surface of the silicene film by means of ALD in the ALD chamber.

24. The naturally hydrogenated silicene film produced by the process of claim 13.

* * * * *